US006576899B2

(12) United States Patent
Sinha et al.

(10) Patent No.: US 6,576,899 B2
(45) Date of Patent: Jun. 10, 2003

(54) DIRECT DETECTION OF LOW-ENERGY CHARGED PARTICLES USING METAL OXIDE SEMICONDUCTOR CIRCUITRY

(75) Inventors: Mahadeva P. Sinha, Temple City, CA (US); Mark V. Wadsworth, Sierra Madre, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/683,509

(22) Filed: Jan. 10, 2002

(65) Prior Publication Data

US 2002/0117617 A1 Aug. 29, 2002

Related U.S. Application Data

(60) Provisional application No. 60/262,020, filed on Jan. 16, 2001.

(51) Int. Cl.[7] ......................... H01J 37/244; H01J 49/30

(52) U.S. Cl. ......................... 250/299; 250/283; 250/397

(58) Field of Search ................................ 250/299, 397, 250/283

(56) References Cited

U.S. PATENT DOCUMENTS 3,806,772 A * 4/1974 Early ......................... 257/239
6,180,942 B1 * 1/2001 Tracy et al. ................ 250/299
6,437,342 B2 * 8/2002 Johnson ...................... 250/397

FOREIGN PATENT DOCUMENTS

WO WO97/39474 10/1997

OTHER PUBLICATIONS http://www.accessscience.com/server–java/Arknoid/science/AS/Encyclopedia/1/12/Est_125200_frameset.html.*

McGraw–Hill, Engineering & Materials: Electrical & Electronics Engineering: Physical electronics: Charge–coupled devices, www.accessscience.com, 2000, pp. 1–7.

* cited by examiner

*Primary Examiner*—Jack Berman
(74) *Attorney, Agent, or Firm*—Fish & Richardson P.C.

(57) ABSTRACT

An electronic ion detection system which may detect low-energy charge particles such as ions from, for example, a mass spectrometer system. The capacitive sensors are located with two plates which are separated by an insulator. The ions which impinge on one of the plates cause charge to be created. That charge may be amplified and then handled by a charge mode amplifier such as a CCD sensor. That CCD sensor may operate using fill and spill operations.

29 Claims, 3 Drawing Sheets

Figure 1:
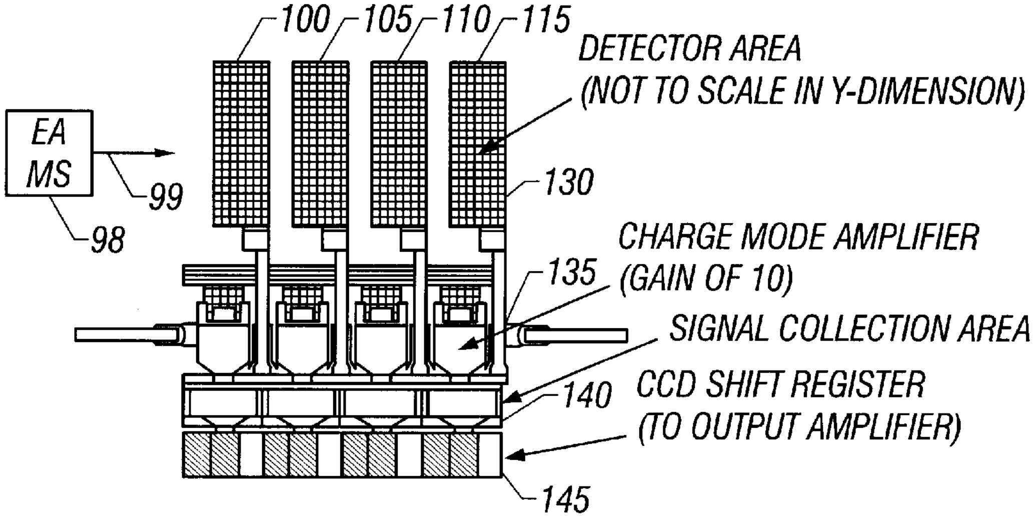

DIRECT DETECTION OF LOW-ENERGY CHARGED PARTICLES USING METAL OXIDE SEMICONDUCTOR CIRCUITRY

CROSS REFERENCE TO RELATED APPLICATIONS

This application claims priority from provisional application No. 60/262,020 filed on Jan. 16, 2001.

BACKGROUND OF INVENTION

Focal plane mass spectrometers are known. For example, one popular focal plane type mass spectrometer is of the so-called Mattauch-Herzog geometry. These devices spatially separate ions having different masses along the focal plane. An advantage of this kind of spectrometer operation is that 100 percent duty cycle is possible along with the high sensitivity for ion detection. This compares with previous systems such as photographic plates, which may be cumbersome and may lack sensitivity.

An electro-optic ion detector (EOID) is described in U.S. pat. No. 5,801,380 for the simultaneous measurement of ions spatially separated along the focal plane of the mass spectrometer. This device may operate by converting ions to electrons and then to photons. The photons form images of the ion-induced signals. The ions generate electrons by impinging on a microchannel electron multiplier array. The electrons are accelerated to a phosphor-coated fiber-optic plate that generates photon images. These images are detected using a photodetector array.

The EOID, although highly advantageous in many ways, is relatively complicated since it requires multiple conversions. In addition, there may be complications from the necessary use of phosphors, in that they may limit the dynamic range of the detector. A microchannel device may also be complicated, since it may require high-voltage, for example 1 Kv, to be applied. This may also require certain of the structures such as a microchannel device, to be placed in a vacuum environment such as 106 Torr. At these higher pressures of operation, the microchannel device may experience ion feedback and electric discharge. Fringe magnetic fields may affect the electron trajectory. Isotropic phosphorescence emission may also affect the resolution. The resolution of the mass analyzer may be therefore compromised due to these and other effects.

SUMMARY OF INVENTION

The present application defines a charge sensing system which may be used, for example, in a Mass Spectrometer system, e.g. a GCMS system, with a modified system which allows direct measurement of ions in a mass spectrometer device, without conversion to electrons and photons (e.g., EOID) prior to measurement. An embodiment may use charge coupled device, "CCD" technology. This CCD technology may include metal oxide semiconductors. The system may use direct detection and collection of the charged particles using the detector. The detected charged particles form the equivalent of an image charge that directly accumulates in a shift register associated with a part of the CCD. This signal charge can be clocked through the CCD in a conventional way, to a single output amplifier. Since the CCD uses only one charge-to-voltage conversion amplifier for the entire detector, signal gains and offset variation of individual elements in the detector array may be minimized. This may prove to be an advantage over CMOS technology.

DETAILED DESCRIPTION

FIG. 1 shows an embodiment. A mass spectrometer system 98, which may be a gas chromatograph-mass spectrometer combination or a mass spectrometer alone, produces ions along a focal plane 99. Ions of different masses are spatially separated along the focal plane. These ions should be measured along the focal plane with individual detectors with high spatial resolution. According to the embodiment, measurement of the ions on the focal plane may use an electronic linear array detector.

An array of capacitive elements coupled to a CCD shift register form a detector for the charged particles along the focal plane. In the embodiment, a linear array of CCD pixels 100, 105, 110, 115 is formed along a focal plane 99. Each pixel is formed using conventional three-phase CCD process technology. Each pixel has a capacitive sensing element part 130, formed of two layers of conductive material insulated from one another. The conductive material may be, for example, aluminum or other conductive wiring material. The capacitive sensing elements may be coupled to the CCD shift register using a charge mode input structure 135. The charge mode input structure is typically known as a fill-and-spill input structure. This element senses the charge that is collected on a capacitive sensing element and creates a packet of signal charge that is proportional to the charge on the capacitor. Fill and spill is well known in the art, and is described, for example, in D. D. Buss et al, "Applications to Signal Processing", Charge Coupled Devices And Systems, 1979. Fill and spill may produce linearity of greater than 100 db with negligible offset levels. The fill and spill structure may also effectively provide gain in the charge domain. For example, the charge mode amplifier in this embodiment may have a gain of 10. The output of the charge mode amplifier is sent to a signal collection area 140, and then to a CCD shift register 145. Further detail on this structure is provided herein.

Figure 2:
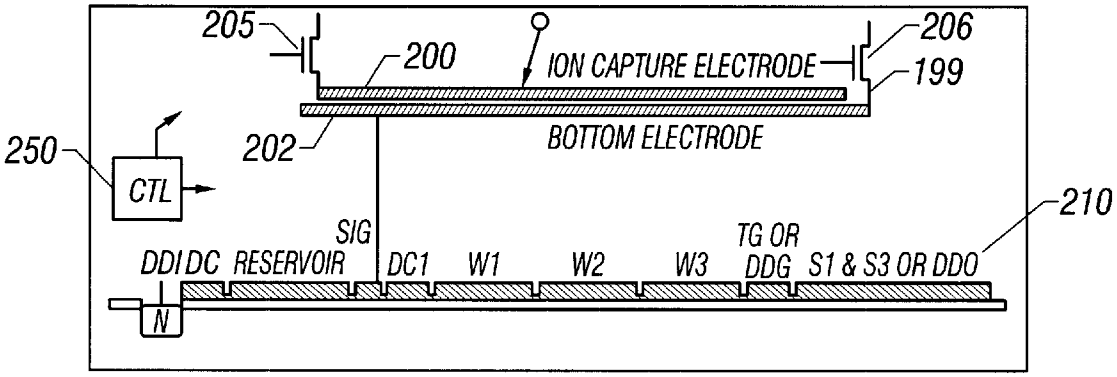

FIG. 2 shows a representation of the unit cell operating as a charged particle detector. As described above, the ions are captured by a pair of electrodes, including an ion capture electrode 200,and a bottom electrode 202. Incident charged particles are captured by the electrode pair.

Each of the electrodes is connected to a respective transistor; electrode 200 is connected to transistor 205 and electrode 202 is connected to transistor 206. The transistors are actuated to periodically reset the potential on the electrodes 200,202 to a reset level. Gates 210 are located below the electrodes. The gates 210 comprise the fill and spill input, level control gates and CCD register part. A controller 250, which may be part of the detector, or some external unit, may control the production of the signals described herein, in the sequence that is described herein.

Figure 3:
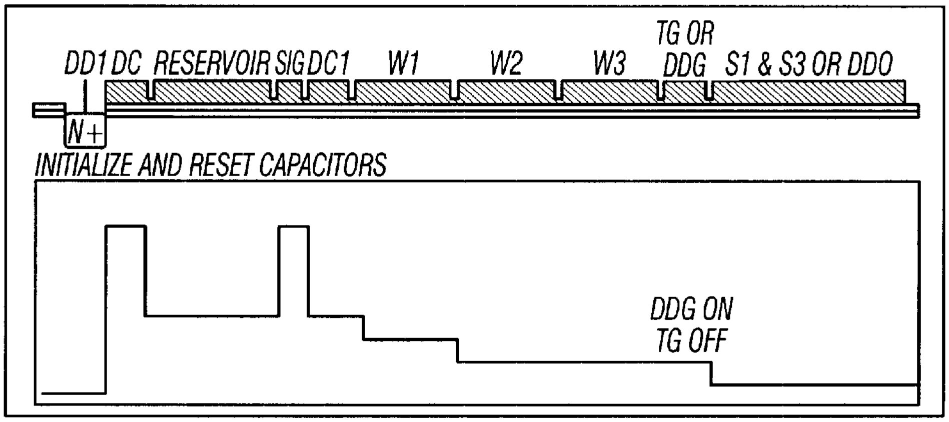

FIG. 3 illustrates the device initialization procedure, in which the detection capacitor 199 is initialized and reset. The first part of the device operation requires that the top and bottom electrodes 200, 202 of the detection capacitor 199 be reset to a known potential. The respective field effect transistors 205 are therefore actuated to apply a known potential to the electrodes 200, 202. The bias on DD1 may be lowered. A bias is also applied via the "SIG" gate.

Figure 4:
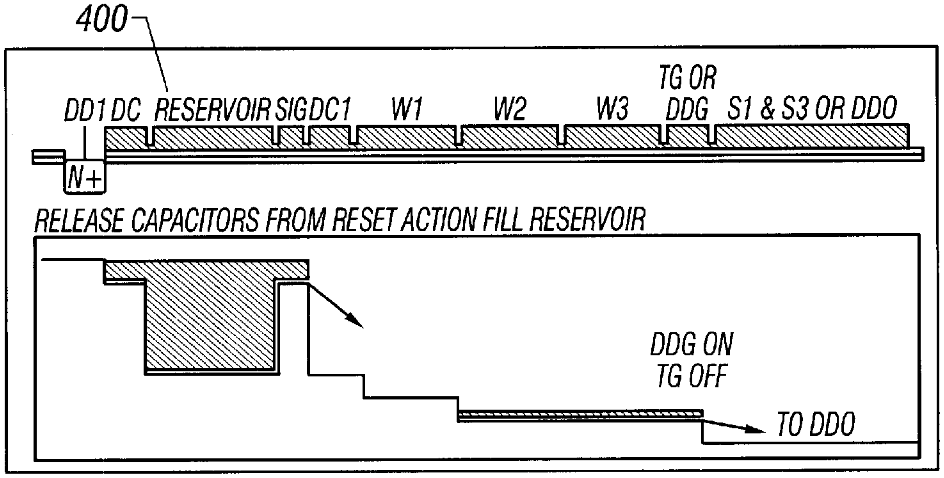

FIG. 4 illustrates releasing the capacitors from reset, and filling the "reservoir" area, under the reservoir gate 400, with charge, as part of the fill and spill. First, the bias applied to the diode region DD1 is raised towards ground. This has the effect of providing a source of charge which spills over the barrier formed by the gate DC and into the reservoir area. During this time, the gate DDG is held in the on state, which allows overflowing charge to be directly removed from the structure through the drain diode DDO.

Figure 5:
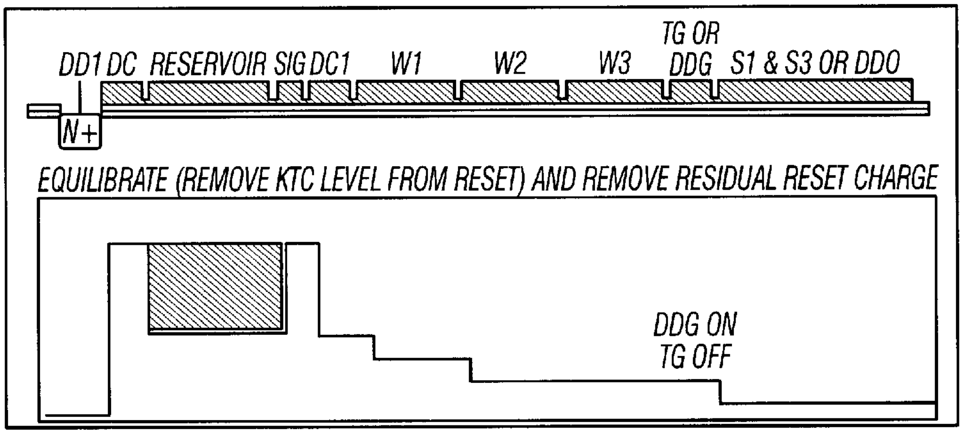

In FIG. 5, the reset FETs 205,206 are turned off. The diode DD1 is also rebiased to its initial positive level. The output gate DDG/TG is maintained off. This allows the signal in the reservoir to come to equilibrium. In this way, any residual reset charge is removed.

This fill and spill operation as described above may substantially compensate against sensitivity to the absolute voltage level that is applied to the capacitor plates. Thus, any variations in FET threshold, both inherent FET threshold, and radiation induced FET threshold, become less important. These variations may not result in signal offset variations within the unit cells that form the detector array. This may also remove KTC noise that may otherwise be present as a result of filling a well with charge via a diode source.

Figure 6:
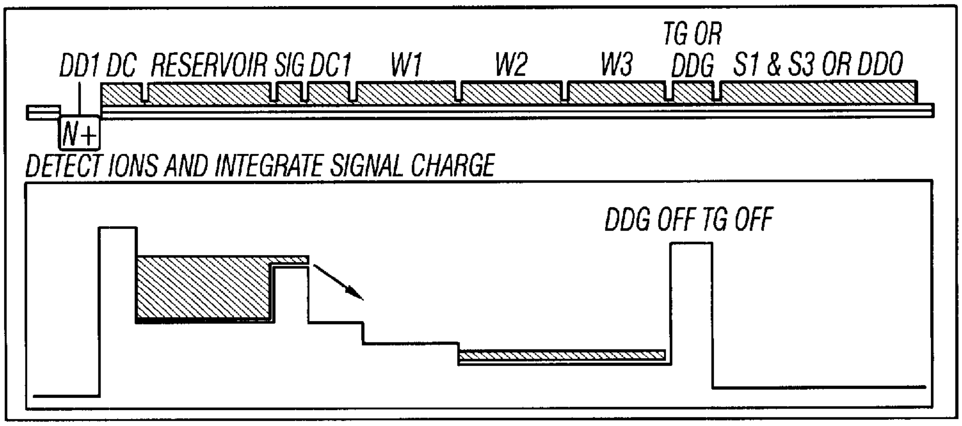

FIG. 6 shows the result when all equilibrium operations are complete. The structure then begins to detect charged particles. As the particles are detected on the capacitor plates, the charge from those particles changes the voltage level on the gate SIG. This voltage change allows packets of charge to flow from the reservoir, across the SIG gate and into the collection wells under the gates W-2 and W-3. By using a large reservoir and a smaller SIG gate, amplification may occur in the charge domain. A small change on the SIG gate may produce a larger amount of charge flow from the reservoir. At the end of a desired part of the cycle, the DDG/TG gate may be biased to prevent further charge transfer.

Figure 7:
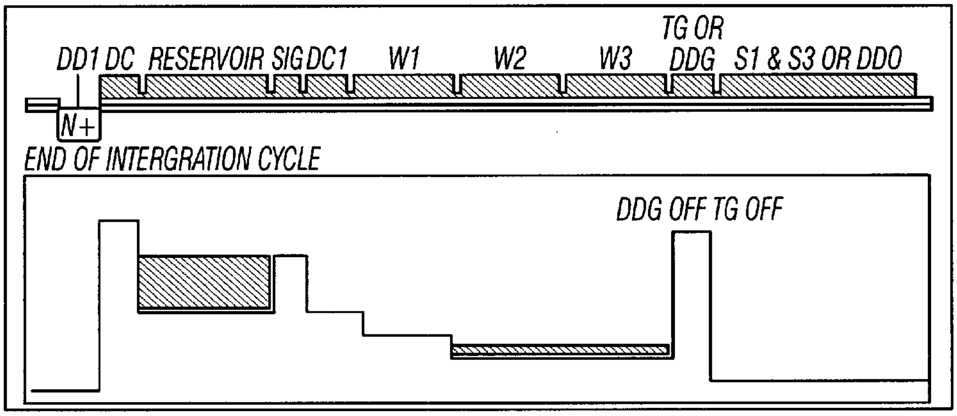

FIG. 7 illustrates the end of the integration cycle. The potential level within the silicon well defined by the SIG gate potential determines the amount of integrated signal charge. The charge detection and signal integration can continue until the potential produced by the SIG gate drops below the level of charge that is being held under the reservoir. In reality, integration can be halted at any time using the reset transistors 205,206.

Figure 8:
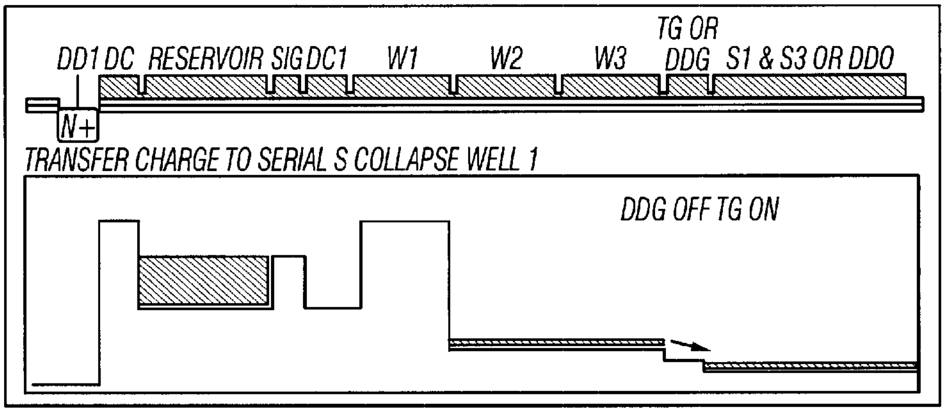
Figure 9:
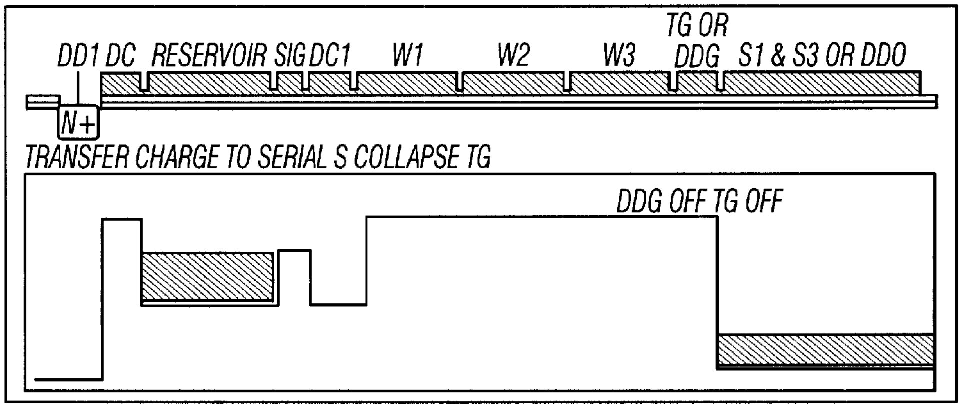

FIGS. 8 and 9 show how the collected signal charge is transferred from the storage wells under gates W-2, W-3 into the CCD shift register S1, S2. FIG. 8 shows transferring the charge form the collection region into the CCD shift register. Then, FIG. 9 shows the completed operation, with the charge in the CCD shift register. The transfer is carried out by applying appropriate biases to the control gates. Charge is then detected at the output of the CCD shift register by a standard charge-to-voltage conversion stage.

Although only a few embodiments have been disclosed in detail above, other modifications are possible. For example, the embodiment disclosed above describes using a single, large, detection capacitor formed from two continuous plates. An alternative system, however, may use a series of smaller detection capacitors, connected in series through a second set of CCD registers. The second set of registers may be connected orthogonal to the CCD shift register. The registers may sum charge packets from each of the small capacitances. This system may allow faster operation and improved noise performance in some conditions.

All such modifications are intended to be encompassed within the following claims, in which:

1. A system, comprising:

an entry portion for ions; and a linear array of electronic ion detecting elements, each element of the array being located in a different location along an ion focal plane, and each element of the array directly detecting a charge produced by an ion, using a charge mode amplifier which receives a signal indicative of charge and amplifies the charge signal, and producing a signal indicative of the charge thereof.

2. A system as in claim 1, wherein said each element of the array includes structure formed using CCD technology.

3. A system as in claim 1, further comprising a mass spectrometer, producing said ions along said focal plane.

4. A system as in claim 1, wherein said electronic ion detection elements include ion detectors, which produce a charge mode output indicative of an amount of charge received thereby.

5. A system as in claim 4, wherein said ion detectors include first and second electrodes which are separated by an insulator.

6. This system as in claim 4, wherein said ion detectors each include a capacitive sensing element.

7. A system as in claim 1, further comprising a CCD shift register, receiving the amplified charge from said charge mode amplifier.

8. A system as in claim 1, wherein said ion detectors each include a first electrode, configured to receive an ion, a second electrode, spaced from said first electrode, and an output signal capturing element, which produces an output signal indicative of charge from received ions.

9. A system as in claim 8, further comprising first and second reset elements, respectively connected to reset an amount of charge on said first and second electrodes.

10. A system as in claim 1, further comprising a reset element for said electronic ion detection element.

11. A system as in claim 9, further comprising a plurality of additional gates, accumulating charge received from said electronic ion detection element.

12. A system as in claim 11, wherein said plurality of additional gates define a charge reservoir for charge accumulated by said ion detectors.

13. A system as in claim 1, further comprising a CCD shift register, receiving charge from said electronic ion detection element.

14. A system, comprising:

an entry portion for ions; and a linear array of electronic ion detecting elements, each element of the array being located in a different location along an ion focal plane, and each element of the array directly detecting a charge produced by an ion using a charge mode amplifier, receiving said signal indicative of charge and amplifying the charge signal, and producing a signal indicative of the charge thereof wherein said plurality of additional gates define a charge reservoir for charge accumulated by said ion detectors; and a control, which controls said gates to first fill and then spill contents of said charge reservoir.

15. A system as in claim 14, wherein said controller controls said gates to receive an accumulated charge after said fill and spill.

16. A method of operating a mass spectrometer which produces separated ions, comprising:

providing an array of electronic devices which respectively receive ions;

resetting said electronic devices, and filling and spilling said electronic devices;

receiving ions in said electronic devices which ions are indicative of an element being analyzed; and amplifying the charge produced by said ions;

transferring the amplified charge produced by said ions to a CCD shift register.

17. A method as in claim 16, wherein said providing an array comprises comprising an array of capacitor sensing elements which receive charge from said ions.

18. A method as in claim 17, wherein said array is a linear array with different capacitive sensing elements located in different linear locations.

19. A method as in claim 18, wherein said resetting comprises applying known potentials to both electrodes of the capacitive sensor.

20. A method as in claim 18, wherein said fill and spill comprises filling a charge reservoir with charge from a charge containing node, allowing said reservoir to equilibrate, and then integrating signal charge into said reservoir.

21. A system, comprising:

a focal plane area, located in a location to receive ions from a mass spectrometer system;

a plurality of charge detecting elements, located in a linear array along said focal plane area, each of said charge detecting elements formed of first and second electrodes which receive said ions, and produce a charge signal based on said ions; and a CCD based processing system, receiving said charge from said plurality of charge detecting elements, amplifying and processing said charge to produce an output signal indicative thereof wherein CCD based processing system operates to fill and spill prior to acquiring charge indicative of a signal.

22. A system as in claim 21, wherein said plurality of charge detecting elements each include reset elements which reset the charge detecting elements to a specified level.

23. A system as in claim 22, wherein the reset elements include a first reset element associated with a first electrode and a second reset element associated with a second electrode.

24. A system as in claim 21, wherein said CCD based processing system includes a charge mode amplifier.

25. A system as in claim 24, wherein said charge mode amplifier is formed with first and second gates of different sizes, and a ratio between sizes of said first and second gates sets an amount of amplification of charge.

26. A system, comprising:

a mass spectrometer system, producing ions having energies indicative of an element being analyzed;

an electronic detector, which produces charge based on receiving said ions, said electronic detector formed of a linear array of ion detecting elements, each receiving ions incident thereupon and producing charge based on receiving said ions;

a charge mode amplifier, operating to amplify said ions; and a reset element that fills and spills said array to reset levels of said array.

27. A system as in claim 26, wherein said electronic detector includes a capacitive sensor.

28. A system as in claim 27, wherein said capacitive sensor includes first and second electrodes, a first of which receives said ions, and a second of which is separated fromsaid first electrode.

29. A system as in claim 28, further comprising a reset element, operating to reset said capacitive sensor to known levels.

* * * * *

UNITED STATES PATENT AND TRADEMARK OFFICE

CERTIFICATE OF CORRECTION

PATENT NO. : 6,576,899 B2 
DATED : June 10, 2003
INVENTOR(S) : Mahadeva P. Sinha and Mark V. Wadsworth, Ph.D.

It is certified that error appears in the above-identified patent and that said Letters Patent is hereby corrected as shown below:

Column 1,
Before line 4, please add the following:
-- This invention described herein was made in the performance of work under a NASA contract, and is subject to the provisions of Public Law 96-517 (U.S.C. 202) in which the Contractor has elected to retain title. --

Signed and Sealed this

Twenty-sixth Day of August, 2003

JAMES E. ROGAN
*Director of the United States Patent and Trademark Office*